United States Patent [19]

Garabedian et al.

[11] Patent Number: 5,576,251
[45] Date of Patent: Nov. 19, 1996

[54] PROCESS FOR MAKING A SEMICONDUCTOR SENSOR WITH A FUSION BONDED FLEXIBLE STRUCTURE

[75] Inventors: Raffi M. Garabedian, San Leandro; M. Salleh Ismail, Newark; Gary J. Pashby, San Jose; Jeffrey K. K. Wong, Fremont, all of Calif.

[73] Assignee: Kavlico Corp., Moorpark, Calif.

[21] Appl. No.: 395,397

[22] Filed: Feb. 22, 1995

Related U.S. Application Data

[62] Division of Ser. No. 318,918, Oct. 6, 1994.

[51] Int. Cl.⁶ .................................................. H01L 21/465
[52] U.S. Cl. .......................... 437/228; 437/239; 437/901; 437/927
[58] Field of Search .................................. 437/901, 927, 437/228, 239

[56] References Cited

U.S. PATENT DOCUMENTS

| | | | |
|---|---|---|---|
| 3,506,502 | 4/1970 | Nakamura | 437/239 |
| 4,426,768 | 1/1984 | Black et al. | 29/583 |
| 4,495,820 | 1/1985 | Shimada et al | 73/724 |
| 4,516,316 | 5/1985 | Haskell | 29/576 W |
| 4,554,726 | 11/1985 | Hillenius et al. | 29/571 |
| 4,571,661 | 2/1986 | Hoshino | 361/283 |
| 4,658,279 | 4/1987 | Guckel | 357/26 |
| 4,812,888 | 3/1989 | Blackburn | 357/26 |
| 4,861,420 | 8/1989 | Knutti et al. | 156/633 |
| 4,894,698 | 1/1990 | Hijikigawa et al. | 357/26 |

(List continued on next page.)

FOREIGN PATENT DOCUMENTS

| | | | |
|---|---|---|---|
| 62-120051 | 1/1987 | Japan | H01L 21/94 |
| 2242313 | 9/1991 | United Kingdom . | |
| 83001536 | 4/1983 | WIPO . | |
| 85005731 | 12/1985 | WIPO . | |

OTHER PUBLICATIONS

Nathanson, H. C. and R. A. Wickstrom, "A Resonant–Gate Silicon Surface Transistor With High–Q Band–Pass Properties," Applied Physics Letters, vol. 7, No. 4, Aug. 15, 1965, pp. 84–86.

Sprenkels et al., "A Theoretical Analysis of the Electret Air–Gap field–Effect Structure for Sensor Applications," sensors and Actuators, 9, 1986, pp. 59–72.

Steinbruchel, Christoph, "The Mechanical Field Effect Transistor: A New Force Sensor," J. Vac. Sci. Technol. A 7(3), May/Jun. 1989, pp. 847–849.

(List continued on next page.)

Primary Examiner—Robert Kunemund
Assistant Examiner—Matthew Whipple
Attorney, Agent, or Firm—Skjerven, Morrill, MacPherson Franklin & Friel; Norman R. Klivans; David T. Millers

[57] ABSTRACT

Fabrication of semiconductor devices with movable structures includes local oxidation of a wafer and oxide removal to form a depression in an elevated bonding surface. A second wafer is fusion bonded to the elevated bonding surface and shaped to form a flexible membrane. An alternative fabrication technique forms a spacer having a depression on a first wafer and active regions on a second wafer, and fusion bonds the wafers together with the depression over the active regions. Devices formed are integrable with standard MOS devices and include FETs, capacitors, and sensors with movable membranes. An FET sensor has gate and drain coupled together and a drain-source voltage which depends on the gate's deflection. Selected operating current, channel length, and channel width provide a drain-source voltage linearly related to gate deflection. Alternatively, two transistors subjected to the same gate deflection provide a differential voltage related to the square root of the deflection if channel currents or channel widths differ. Transistors subjected to the different gate deflections provide a differential signal that cancels effects that are independent of deflection. A capacitive sensor includes a doped region underlying the center of a flexible membrane. The doped region is isolated from a surrounding region which is biased at the voltage of the membrane.

35 Claims, 15 Drawing Sheets

U.S. PATENT DOCUMENTS

| | | | |
|---|---|---|---|
| 4,926,696 | 5/1990 | Haritonidis et al. | 73/205 |
| 4,975,390 | 12/1990 | Fujii et al. | 437/228 |
| 5,095,401 | 3/1992 | Zavracky et al. | 361/283 |
| 5,103,279 | 4/1992 | Gutteridge | 357/25 |
| 5,126,812 | 6/1992 | Greiff | 357/25 |
| 5,155,061 | 10/1992 | O'Connor et al. | 437/86 |
| 5,164,328 | 11/1992 | Dunn et al. | 437/54 |
| 5,187,986 | 2/1993 | Takebe et al. | 73/766 |
| 5,264,075 | 11/1993 | Zanini-Fisher et al. | 156/633 |
| 5,316,619 | 5/1994 | Mastrangelo | 156/644 |
| 5,329,110 | 7/1994 | Shimabukuro et al. | 250/207 |
| 5,349,492 | 9/1994 | Kimura et al. | 361/283.4 |
| 5,472,916 | 12/1995 | Bertagnolli et al. | 437/228 |

OTHER PUBLICATIONS

Bengtsson, Stefan, "Semiconductor Wafer Bonding: A Review of Interfacial Properties and Applications," Journal of Elec. Materials, vol. 21, No. 8, 1992, pp. 841–862.

Graf et al., "Silicon Membrane Condenser Microphone with Integrated Field–Effect Transistor," Sensors and Actuators A, 37–38, 1993, pp. 708–711.

'Silicon Micromechanics: . . . on a chip', IEEE Spectrum, Jul. 1990, p. 29.

PROCESS FOR MAKING A SEMICONDUCTOR SENSOR WITH A FUSION BONDED FLEXIBLE STRUCTURE

CROSS-REFERENCE TO RELATED APPLICATION

The application is a division of application Ser. No. 08/318,918 filed Oct. 6, 1994 pending.

BACKGROUND OF THE INVENTION

1. Field of the Invention

This invention relates to semiconductor devices having structures which move and change the electrical properties of the devices, processes for making such devices, and methods for using such devices in sensors.

2. Description of Related Art

Semiconductor devices having movable or deformable structures which change the electrical properties of the devices have been proposed but have technological problems which limit their development. One problem with such devices is that their fabrication requires non-standard processes which decrease yield, increase expense, and make integration with standard MOS devices difficult. Additionally, the operation of such devices has been misunderstood. For example, a field effect transistor (FET) with a movable gate has a threshold voltage which depends on gate position. This fact is central to making practical movable gate transistors but has not been generally recognized.

U.S. Pat. No. 5,155,061 issued Oct. 13, 1992 (O'Connor et al.) discloses a semiconductor pressure sensor incorporating an ungated metal-oxide semiconductor FET. The pressure sensor uses a deep (about 10 µm) depression in a silicon substrate to form a gap between a suspended gate and an underlying channel in the substrate. The deep depression is made before a source, drain, and channel are formed and interferes with standard MOS processes such as spinning on photoresist and photolithography which work best on nearly planar surfaces. Using standard MOS processes, a 10 µm depression would cause a significant reduction in the manufacturing yield of operable devices.

Further, an FET with a 10 µm gap between the gate and the channel would wave a threshold voltage on the order of hundreds of volts. Such gate voltages are too high for most applications. O'Connor et al. fails to teach how to reduce the gap to provide a more practical device. O'Connor et al. also fails to address the effect of electrostatic forces on the gate. Specifically, a bias voltage between the gate membrane and the substrate attracts the gate membrane toward the substrate. This attraction is not very significant with a 10 µm gap, but far more practical FETs having sub-micron gate-channel gaps electrostatic attraction is important.

U.S. Pat. No. 4,812,888 issued Mar. 14, 1989 (Blackburn) describes FET having a smaller gap. Blackburn forms a movable gate for the FET by depositing a gate material such as polysilicon or metal over a sacrificial layer and then chemically etching the sacrificial layer from under the gate diaphragm. Blackburn's FET is more practical than O'Connor's since Blackburn's FET's has a smaller gap and a threshold voltage that can be within a reasonable range. However, Blackburn's fabrication process is defect prone. Chemical etching of sacrificial layers tends to leave a residue on and under the gate diaphragms which causes threshold voltage errors, and the long etching time required to remove material from under a diaphragm can damage other regions of the device. Also, many applications of moving gate field effect transistors require a vacuum between the gate and underlying substrate. Blackburn's fabrication process requires forming a vacuum in a cavity and then sealing the cavity, but no commercially repeatable vacuum sealing technique is currently available.

Blackburn also demonstrates the prior arts' incomplete understanding of MOGFET physics. In particular, Blackburn fails to disclose the strong sensitivity of threshold voltage to gate deflection and does not address the issue of significant electrostatic forces on the gate diaphragm. Known deposited gate diaphragm materials as used in Blackburn are not single crystal and have less than ideal mechanical properties. In particular, these materials are not thermally matched with the substrate, have mechanical hysteresis, and tend to permanently deform. Additionally, the active semiconductor regions shown in Blackburn are not ideal for providing a signal indicating the deflection of the gate diaphragm. Failure to account for these issues leads to manufacturing, reliability, and performance problems.

SUMMARY OF THE INVENTION

Fabrication processes in accordance with this invention yield semiconductor micro-machined devices with flexible structures. Such devices include but are not limited to MOving Gate Field Effect Transistors (MOGFETs), MOving Plate CAPacitors (MOPCAPs), pressure sensors, and acceleration sensors. A process in accordance with an embodiment of this invention uses multiple local oxidations (LOCOS) of a semiconductor wafer to form a sculptured depression and an elevated bonding surface on a mesa. Formation of active regions in the wafer uses a near-standard MOS process which allows integration of micro-machined semiconductor devices and standard MOS devices. A membrane material such as monocrystalline silicon is fusion bonded to the elevated bonding surface. The fusion bonding can be unaligned and provides a high manufacturing yield.

In another process in accordance with this invention, standard MOS techniques form active regions on a first semiconductor wafer and a spacer on a second wafer. The spacer has a depression and an elevated bonding surface for fusion bonding of the first and second wafers. The spacer is typically ring-shaped and defines walls of a cylindrical depression. Aligned fusion bonding of the wafers aligns the depression in the spacer on the second wafer with active regions in the first wafer. The second wafer is then micro-machined to form a desired flexible structure.

In a sensor in accordance with this invention, a MOGFET at a constant saturation current with gate and drain coupled together, has a drain-source voltage which depends on the deflection of a gate membrane.

A MOGFET in accordance with an embodiment of this invention includes a substrate having an elevated mesa on one of its surfaces. A flexible structure that may be sculpture with varying thicknesses is fusion bonded to the mesa and forms a gate suspended over active regions in the substrate. A channel width to channel length ratio and an operating current can be selected to minimize non-linear dependence of the drain-source voltage of the MOGFET on gate deflection or to minimize temperature dependence of the MOGFET.

A MOGFET in accordance with another embodiment of this invention has a flexible gate structure which spans a cavity and modulates a channel formed in a bottom surface of the cavity. The bottom of the cavity is a semiconductor substrate. The top of the cavity is the gate structure. The cavity thus formed may contain a vacuum or be open to the ambient. The gate structure is normally 0.1 to 0.3 μm or more above the channel and moves towards or away from the channel with applied force. The MOGFET may be used to measure contact force, position, fluid or gas pressure, acoustic pressure, or inertial force.

Another embodiment of a MOGFET in accordance with this invention includes two channels under a single flexible gate structure. The two channels are positioned and shaped symmetrically relative to the gate so that gate structure movement keeps the gate equidistant from both channels. When the two channels have the same size and carry different currents, a difference between source voltages for the two channels is proportional to the square root of the gate's deflection plus a constant. When the two channels have different sizes and carry identical currents, a difference between source voltages is also proportional to the square root of the gate's deflection plus a constant.

A device configuration in accordance with another embodiment of the invention includes a first channel according to any of the above embodiments and one or more additional channels controlled by the same gate. The additional transistor channels are positioned to experience different gate deflections. A differential measurement of source voltages for two different channels cancels constant offset voltages and reduces temperature sensitivity and other common mode effects.

A capacitive sensor in accordance with this invention includes a flexible membrane structure and a heavily doped region underlying the center of the membrane. Deflection of the membrane changes capacitance between the membrane and the heavily doped region significantly, because deflection is largest at the membrane's center which is over the heavily doped region. Deflection is less away from the membrane's center and has a smaller capacitive effect on underlying regions. The heavily doped region is isolated from a surrounding region which is away from the membrane's center, and the surrounding region is biased at the same voltage as the membrane so that the surrounding region does not contribute to the capacitance of the sensor. This increases the signal to noise ratio for the capacitive sensor because only regions most strongly affected by membrane deflection contribute to the capacitance. A second region surrounding the heavily doped region can form a plate of a reference capacitor used to cancel offsets, common mode effects, and temperature effects in capacitance sensor.

BRIEF DESCRIPTION OF THE DRAWINGS

Use of the same reference symbols in different figures indicates similar or identical elements.

DETAILED DESCRIPTION OF THE PREFERRED EMBODIMENTS

Figure 1A:
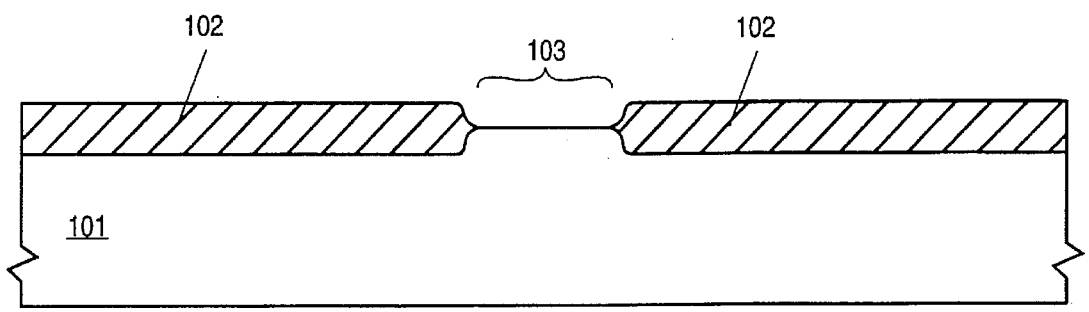
FIGS. 1A, 1B, 1C, 1D, 1E, 1F, 1G, 1H, 1I, and 1J show cross-sectional views of an integrated circuit formed using a process in accordance with this invention.

In accordance with this invention, MOving Gate Field Effect Transistors (MOGFETs) or MOving Plate CAPacitors (MOPCAPs) are formed using processes that closely conform to standard MOS processes and thereby enable the integration of on-chip electronics with the MOGFETs or MOPCAPs. In one process in accordance with this invention, local oxidation (LOCOS) followed by removal of oxide forms a mesa and a depression in the mesa on a first semiconductor substrate. LOCOS and oxide removal may be repeated to form additional level of surface structure. A second substrate is fusion bonded to the first substrate across the depression and then shaped to form a flexible gate membrane. Standard MOS devices can be fabricated in the first substrate in an area surrounding the mesa.

In another process in accordance with this invention, standard MOS processes form active regions for a MOGFET or MOPCAP in a first semiconductor substrate and form a ring shaped spacer on a second semiconductor substrate. An aligned fusion bonding step bonds the first and second substrates together and encloses the active regions within the boundaries of the ring. The second substrate is then shaped to form a gate membrane. The standard or near-standard MOS processes can easily integrate conventional MOS devices on the first or second substrate.

Novel layouts of sources, drains, and channels in sensors in accordance with this invention permit unique operating modes for sensing movement of flexible membranes. One embodiment of a MOGFET sensor in accordance with this invention includes two channels located under a flexible gate membrane. The two channels are symmetrically positioned relative to the gate membrane so that movement of the gate membrane keeps the gate membrane equidistant from both channels. If the two channels arm the same size and currents driven through the two channels differ, a voltage difference between two sources adjacent to the two channels is proportional to the square root of the gate membrane's deflection plus a constant. Alternatively, if the two channel regions have different sizes, identical currents through the two channel regions cause a voltage difference between the sources which is proportional to the square root of the gate membrane's deflection plus a constant. The voltage difference is relatively insensitive to the sensor's temperature.

A sensor in accordance with another embodiment of the invention provides differential voltage measurement between transistors or pairs of transistors having different gate deflections, to cancel constant offset voltages and reduce temperature sensitivity which are independent of gate deflection.

A fabrication process for a MOGFET in accordance with an embodiment of this invention is illustrated in FIGS. 1A to 1J. The process of FIGS. 1A to 1J includes a standard or near-standard MOS process which forms MOS devices and active areas for the MOGFET. Conforming to a standard and well developed process currently practiced in the industry affords great advantages in cost, process control, yield, and reliability. Fusion bonding and micro-machining form flexible gate membranes after the standard MOS process forms the require active regions.

Figure 1B:
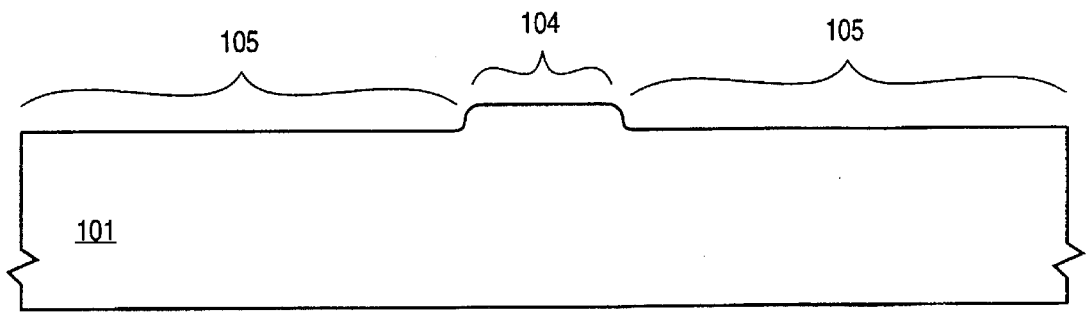

FIG. 1A illustrates a silicon substrate 101 after local oxidation (LOCOS) forms silicon dioxide regions 102. LOCOS is a standard and well known technique and common as the first step in many MOS processes for forming field oxide isolation regions. In the process of FIGS. 1A to 1J, LOCOS forms field oxide isolation regions and also shapes the surface of wafer 101. Using LOCOS to shape a surface is sometimes referred to herein as LOCOS micro-machining. LOCOS consumes a thin layer (about 45% of thee oxide thickness or roughly 0.1 to 0.8 μm) from the surface of substrate 101 in forming oxide regions 102. Removal of oxide regions 102 leaves a mesa 104 surrounded by a lower plane region 105 (also referred to herein as device plane 105) as illustrated in FIG. 1B. Typically, standard semiconductor devices such as field effect or bipolar transistors are formed in device plane 105, but devices such as isolation rings and feedthrough interconnects are also formed in and on mesa 104.

In one particular process, silicon substrate 101 is an N+ silicon substrate with a P type epitaxial layer about 7 μm thick having a resistivity of about 27 Ω·cm. A typical LOCOS step includes: forming a thin pad oxide layer (not shown); depositing a silicon nitride layer on the pad oxide layer; forming a composite mask overlying and covering region 103; etching away the exposed parts of the silicon nitride layer to expose regions of silicon for oxidization; and oxidizing the exposed regions in a wet oxygen atmosphere at about 1050° C. for about 500 minutes to form silicon dioxide regions 102 that are about 1.6 μm thick. The silicon nitride that protects region 103 from oxidation during the LOCOS step is stripped using a standard process such as plasma etching or application of hot phosphoric acid before or after removal of oxide regions 102 and the pad oxide layer. Standard techniques such as wet etching remove oxide regions 102 and leave silicon substrate 101 as shown in FIG. 1B with the top of mesa 104 about 0.72 μm above device plane 105.

In the process of FIGS. 1A and 1B, a top surface of mesa 104 is flat after the first LOCOS step. Alternatively, the first LOCOS step may form an initial depression on top of mesa 104. The contours of the depression may be further defined during a second LOCOS step described below. The top of mesa 104 is typically less than 2 μm but more than 500 Å above device plane 105 of substrate 101 and provides an elevated bonding surface for fusion bonding of a second substrate as disclosed below. MOS, bipolar, or other semiconductor devices can be formed in device plane 105. Active regions of the MOGFET reside in a depression to be formed in mesa 104. Typically, for MOGFETs, the doping concentration in mesa 104 is about $10^{15}$ cm$^{-3}$ which is lower than the doping levels of most standard epitaxial layers or substrates used in MOS processes. The lower doping provides MOGFETs with lower threshold voltages.

Figure 1C:
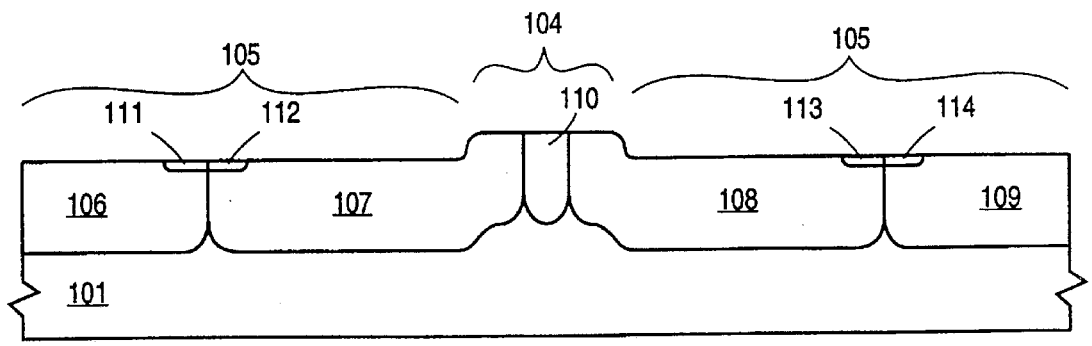

After formation of mesa 104, conventional masking and doping forms isolation wells 106 to 110 shown in FIG. 1C. A conventional ion implantation of N type dopants such as phosphorous includes: forming a thin pre-implant oxide layer; forming a photoresist mask which exposes the regions of N type wells 106, 109, and 110; implanting phosphorous ions; and driving in dopants to a depth of about 4 μm to reach for example, an N+ substrate below an epitaxial layer. Dopants may be driven to a depth greater than the depth of the material removed in a second LOCOS step described below. Conventional techniques also form P type wells 107 and 108, guard rigs 111 to 114, and threshold implants for channels in isolation wells 106 to 110. For example, guard rings 111 to 114 which prevent the formation of parasitic transistors may be formed by ion implantation using combinations of photoresist masks and a silicon nitride mask used during the second LOCOS step.

Figure 1D:
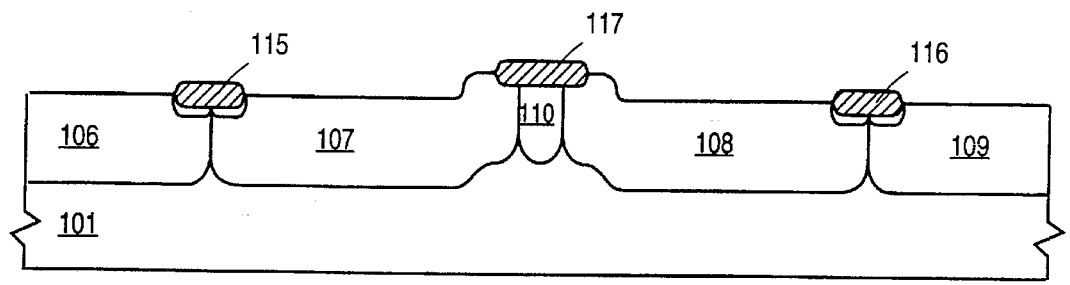
Figure 1E:
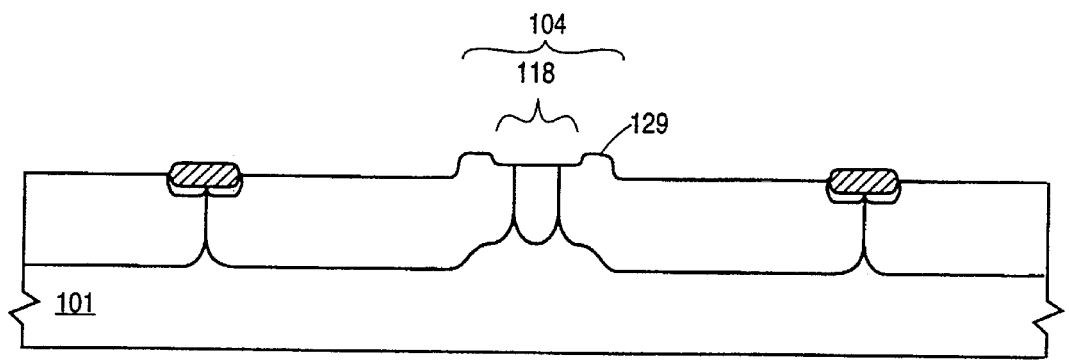

The second LOCOS step forms silicon dioxide regions 115 to 117 shown in FIG. 1D and is performed in the same manner as the first LOCOS step described above. Silicon dioxide regions 115 and 116 are isolation regions formed in device plane 105. A photoresist mask protects regions 115 and 116 when etching removes oxide region 117 to form a depression 118 in mesa 104 as shown in FIG. 1E but leaves an elevated bonding surface 129. A middle plane at the bottom of depression 118 provides an area for formation of the active regions of the MOGFET. Depression 118 is typically from about 1000 Å to about 10,000 Å deep from bonding surface 129 where a gate membrane will be bonded. With a proper choice of channel doping, a gate-channel gap up to 3,000 Å results in a MOGFET threshold voltage of up to about 2 volts.

If a depression was formed on mesa 104 during one LOCOS step, a subsequent LOCOS step can form contours on the middle plane. For example, bumps for containing channels can be formed in the middle plane so that the channels are closer toga gate membrane to provide the desired threshold voltage, and areas surrounding the channels are deeper in substrate 101 to reduce electrostatic attraction between the gate membrane and the middle plane.

Figure 1F:
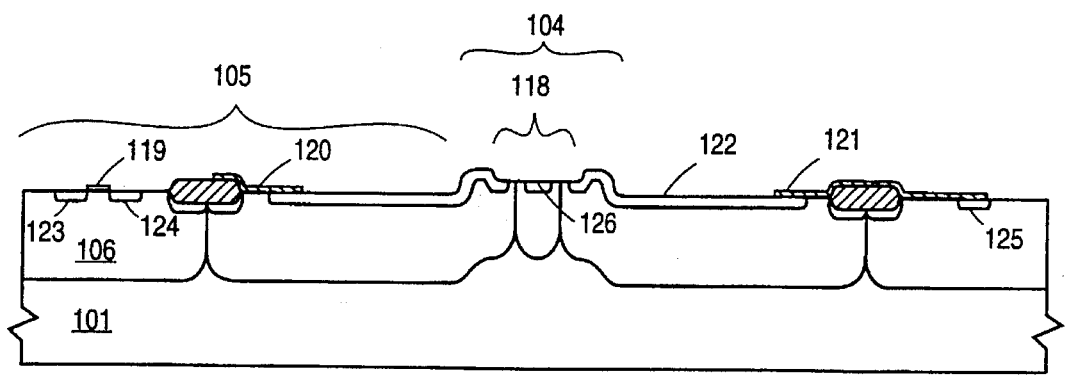

Conventional processing steps form a gate oxide layer (not shown) and a polysilicon layer for a gate 119 of a conventional field effect transistor (FET) shown in FIG. 1F. The gate oxide layer may be left in depression 118 and on mesa 104. Standard P type ion implantation forms source/drain regions 123 and 124 that are self-aligned with gate 119 for a P channel FET in device plane 105. Standard N type ion implantation forms source/drain regions (not shown) for N channel FETs in device plane 105. Source, drain, and channel regions for the MOGFET are formed in depression 118 using the same masks and ion implantation steps that form the semiconductor devices in device plane 105. Depression 118 typically being less than 1 μm deep is shallow enough for use of standard wafer lithography techniques. A polysilicon layer also forms interconnects 120 and 121.

Figure 1G:
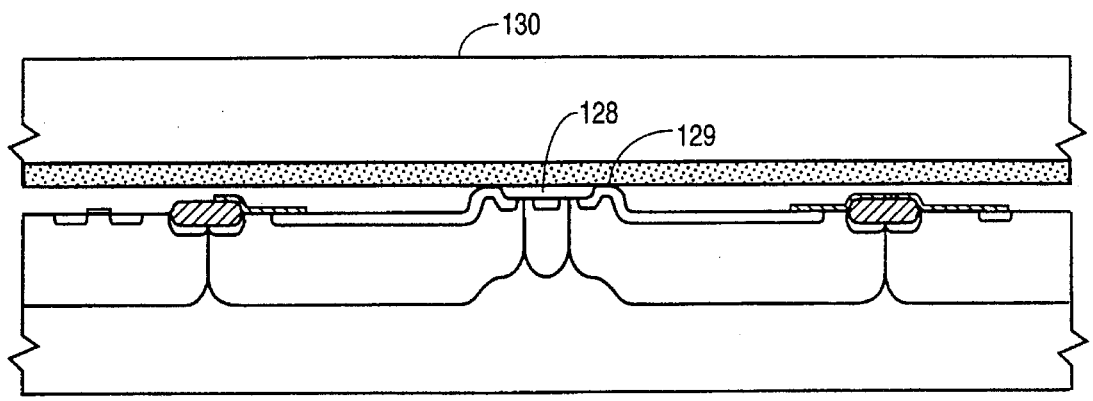

As shown in FIG. 1G, a second silicon substrate 130 is fusion bonded to bonding surface 129 on mesa 104, thereby forming a sealed cavity 128. Fusion bonding is known in the art and bonds two optically smooth silicon surface is with or without a thin layer of dielectric such as silicon dioxide or silicon nitride on the bonding surfaces. Prior to bonding, an oxide layer (not shown) is formed on substrate 101 and protects substrate 101 while substrate 130 is shaped into a membrane structure.

For fusion bonding, substrates 101 and 130 are chemically cleaned using a basic solution such as ammonium hydroxide and water and then thoroughly dried. The two smooth and clean substrates 101 and 130 are then held together in an oxygen atmosphere to form a weak bond. The bonded pair of substrates 101 and 130 is then raised to a temperature of about 950° C. for about 30 minutes. During fusion bonding, chemical reactions remove gases from cavity 128 leaving a vacuum. (Oxygen reacts with the walls of cavity 128 to form a thin layer of silicon dioxide.) Fusion bonding is known in the art and described by Bengtsson, "Semiconductor Wafer Bonding: A Review of Interfacial Properties and Applications", 21(8) J. Electronic Materials 841, 841–862 (1992) which is incorporated by reference herein in its entirety.

Figure 1H:
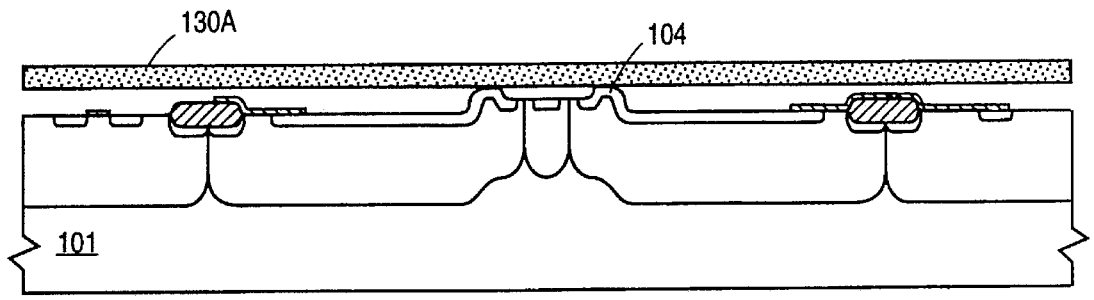
Figure 1I:
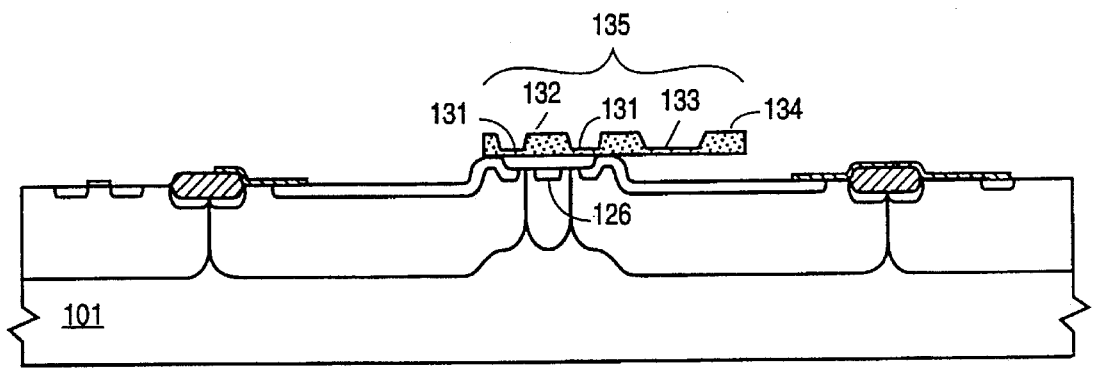

Prior to bonding, at least a portion of substrate 130 is heavily doped to provide a conducting layer for forming a conducting gate membrane. Second substrate 130 is micromachined by multiple masking and etching operations. After bonding, substrate 130 is thinned by grinding, polishing, or etching to form a thinned wafer 130A as shown in FIG. 1H. The thickness of thinned wafer 130A depends on the desired membrane structure to be formed but is typically between about 2 μm and about 7 μm thick. Thinned Wafer 130A is then etched to become a gate membrane 135. An etch-stop layer formed in second substrate 130 prior to bonding limits etching depth and controls the thickness of flexible regions 131 and 133 in gate membrane 135 shown in FIG. 1I. Regions 131 and 133 flex in response to forces applied, for example, by atmospheric pressure, acceleration, or contact. Flexible regions are typically about 2.5 μm thick for accelerometers and about 2 μm to about 6 μm thick for pressure sensors, but more generally, the thickness depend on the span of the suspended structure and may be between about 1 μm and about 10 μm thick.

Gate membrane 135 also includes a mass 132 and cantilever 134. In an accelerometer, the inertia of mass 132 causes deflection of flexible regions 131 during acceleration and moves portions of gate membrane 135 toward or away from active regions 126. The movement of gate membrane 135 changes the threshold voltage of the MOGFET in cavity 128. Active regions of a MOGFET may also be formed in device plane 105 below cantilever 134 so that when cantilever 134 flexes toward or away from the underlying active regions, the threshold voltage of the MOGFET changes indicating the amount of deflection.

Flexible regions 131 and 133 of gate membrane 135 are single crystal structures such as silicon, germanium, or gallium-arsenide which have mechanical properties superior to the deposited materials used in the prior art. In particular, gate membrane 135 has less mechanical hysteresis and less tendency to drift or permanently deform, and is thermally matched to substrate 101. Gate membrane 135 inherits a high doping concentration from substrate 130 and is electrically conducting.

Figure 1J:
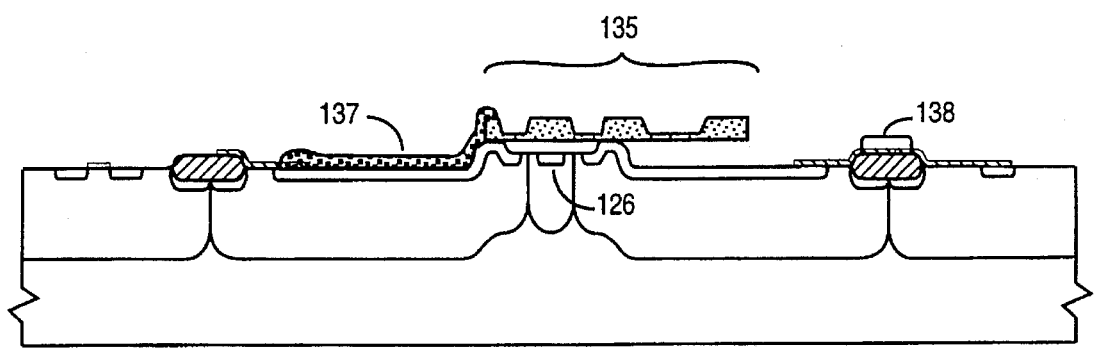

Following formation of gate membrane 135, additional dielectric may be deposited or grown, and conventional techniques form metal contacts 138 and metal interconnects 137 as shown in FIG. 1J. A passivation layer such as silicon nitride, silicon dioxide, or an organic film is conventionally formed on the IC then removed from over flexible membrane 135. The IC is then conventionally packaged for the device type, for example, packaged as a pressure sensor or accelerometer.

Fabrication of a capacitor having flexible membrane 135 proceeds substantially according to the above process with a change being the formation of an active region for charge collection under flexible membrane 135 rather than source, drain, and channel regions.

Processing of substrates as described above follows a near-standard MOS process. The addition of a second LOCOS step is a minor and acceptable deviation from standard MOS processes, and the cavities formed by LOCOS micro-machining have depths typically less than 1 μm which are acceptable for standard lithography techniques.

As an alternative to forming bonding mesa 104 by LOCOS micro-machining early in the fabrication process, a bonding mesa can be formed later, over active regions in a semiconductor substrate. For example, conventional MOS processing of a first substrate forms active regions and MOS devices in and surrounding an area designated for a bonding mesa to be formed. Prior to formation of metal lines, a bonding mesa is formed in the designated area by: selective epitaxial growth of crystalline silicon; deposition and etching of a dielectric such as silicon dioxide or silicon nitride, polysilicon, or other material; or growth and patterning of thermal oxide. A second substrate is fusion bonded to the bonding mesa and shaped into a flexible structure overlying the active regions as disclosed above.

Figure 2A:
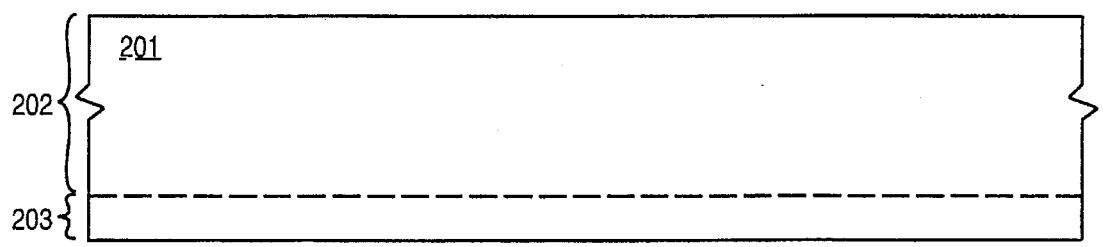
FIGS. 2A, 2B, 2C, 2D, 2E, 2F, and 2G show cross-sectional views of an integrated circuit formed using another process in accordance with this invention.

FIGS. 2A to 2G illustrates another process for forming a MOGFET or MOPCAP. FIG. 2A shows a first wafer 201 which is for forming a flexible gate membrane. First wafer 201 is a conventional semiconductor on insulator (SOI) wafer having a monocrystalline silicon layer 203 on an insulating "handle" layer 202. Silicon layer 203 provides membrane material for flexible regions of a gate membrane to be formed. Other types of wafers containing suitable membrane materials may be employed. For example, a silicon wafer with a buried P+ etch-stop or a P epitaxial layer on N substrate for an electrochemical etch-Stop may be used. Preferably, the wafer includes a monocrystalline membrane material and an etch stop for controlling gate membrane thickness.

Figure 2B:
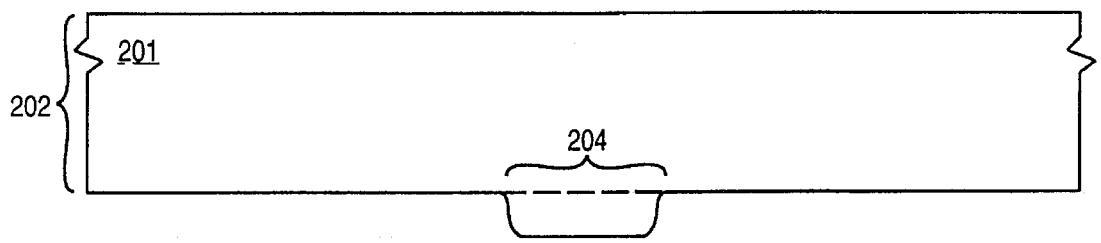
Figure 2C:
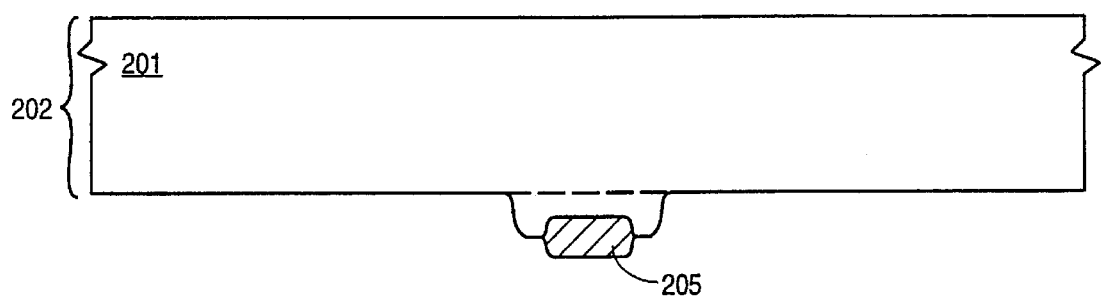

Semiconductor layer 203 is masked and etched using standard techniques such as chemical, plasma, or anisotropic etching or is LOCOS micro-machined to form a silicon mesa 204 as shown in FIG. 2B. A LOCOS step performed as disclosed above forms an oxide region 205 (FIG. 2C) in mesa 204, and the oxide region 205 is removed to form a depression 206 (FIG. 2D) in mesa 204.

Figure 2D:
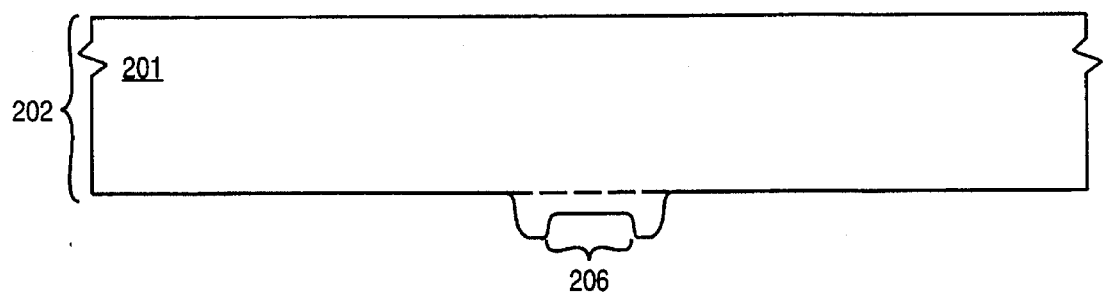
Figure 2E:
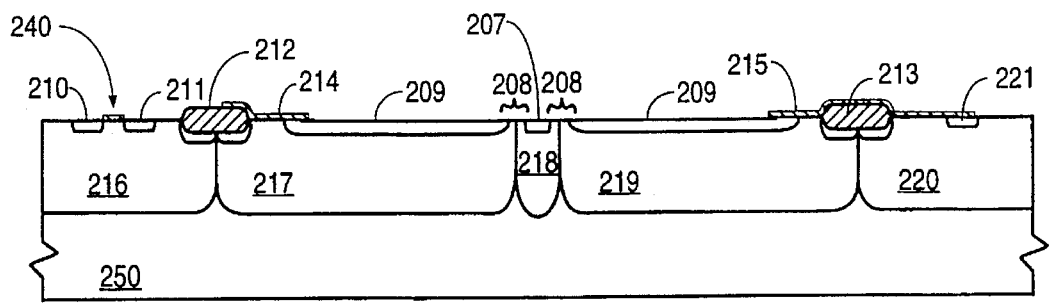

FIG. 2E shows a second semiconductor wafer 250 containing a standard MOS device 240 and active regions 207 to 209 for the MOGFET. In the embodiment of FIG. 2E, device 240 and active regions 207 to 209 are formed with a standard twin-tub single poly CMOS process, but alternatively, any other fabrication process such as NMOS, PMOS, or bipolar processes may be employed. Additionally, LOCOS micro-machining can shape the surface of wafer 250 to, for example create an elevated bonding surface or elevate channels of MOGFETs relative to surrounding source, drain, and isolation regions which underlie a flexible gate membrane. Final metal interconnects are not formed until after fusion bonding of a gate structure to wafer 250.

Figure 2F:
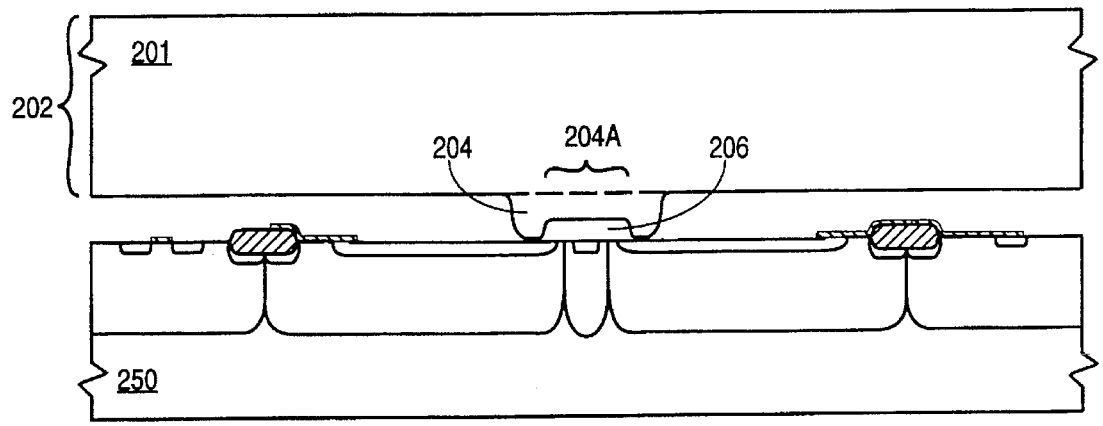
Figure 2G:
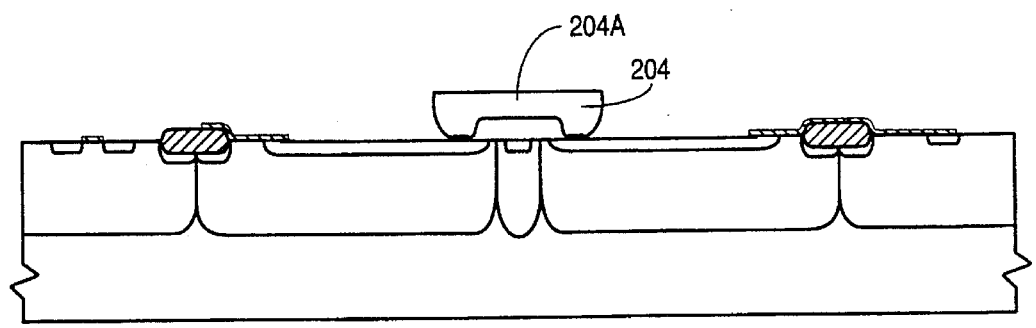

Aligned fusion bonding attaches first wafer 201 of FIG. 2D to second wafer 250 of FIG. 2E, creating the structure of FIG. 2F wherein depression 206 is aligned to enclose portions of active regions 207 to 209. Aligned fusion bonding is known in the art and described by R. W. Bower, M. S. Ismail, and S. N. Farrens, "Aligned Wafer Bonding: A Key to Three Dimensional Microstructure", 20(5) J. Electronic Materials 383, 383–387 (May 1991) which is incorporated by reference herein in its entirety. Aligned fusion bonding includes pretreatment procedures such as chemical cleaning with a basic solution, and then wafers 201 and 250 are aligned with an infrared aligner capable of viewing alignment features on wafers 201 and 250 when wafers 201 and 250 are face to face. Wafers 210 and 250 are brought into contact then annealed at about 950° C. for about 30 minutes to complete the bond. Commercially available bonders such as a BAL6 Bond Aligner from Electron Visions of Schärding, Austria can perform aligned fusion bonding.

Wafer 201 is aligned so that depression 206 overlies a channel 208 of the MOGFET. A portion 204A of mesa 204 between depression 206 and handle substrate 202 forms the flexible regions of a gate membrane after handle substrate 202 is etched. For the embodiment shown in FIG. 2G, handle substrate 202 is removed by mechanical grinding or chemical etching. Alternatively, substrate 202 and mesa 204 are shaped as desired by multiple masking and etching. The integrated circuit can be finished with standard techniques for forming patterned metal layers, passivation, and packaging as describe above. In particular, metal interconnects may couple gate membrane 204A to the standard semiconductor devices formed in and on wafer 250.

Figure 3A:
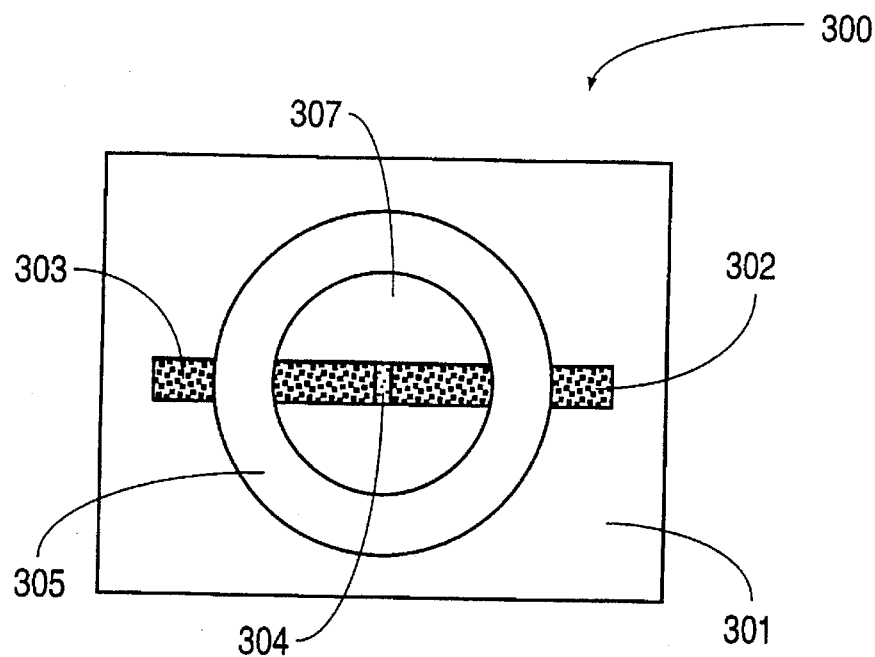
FIGS. 3A and 3B show a plan view and cross-sectional view of a MOGFET in accordance with an embodiment of this invention.
Figure 3B:
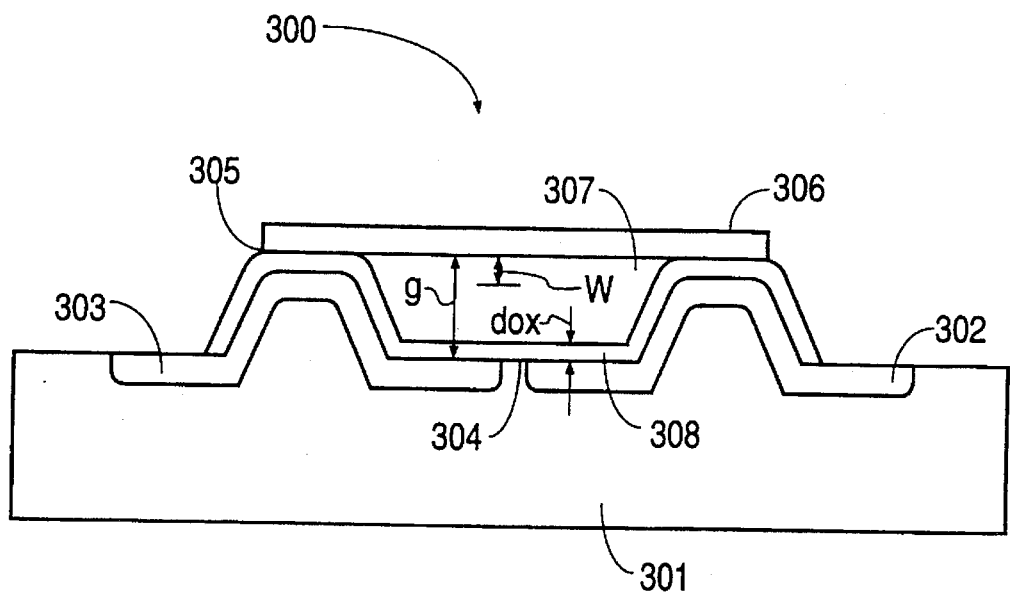

FIGS. 3A and 3B respectively show a schematic plan view and a cross-sectional view of a MOGFET 300 formed in and on a semiconductor substrate 301. MOGFET 300 has a source 302, a drain 303, and a channel 304 diffused into substrate 301. A thin ring-shaped mesa 305 supports a deformable gate membrane 306 around the perimeter of a disk-shaped cavity 307. Although FIG. 3A shows mesa 309 as circular, alternative embodiments include mesas having square, rectangular or any desired perimeter shape. Cavity 307 defined by substrate 301, mesa 305, and membrane 306 is hermetically sealed and contains a vacuum. Gate membrane 306 is a distance g from channel region 304 when zero external pressure is applied. An external pressure applied to gate membrane 306 deflects the nearest portion of gate membrane 306 a distance W toward channel 304.

Deflection of gate structure 306 changes the electrical properties of MOGFET 300. The capacitance C(W) per area, between the deformable gate and the channel is a function of gate deflection W given by eq. 1.

$$C(W) = [(d_{ox}/e_{ox}) + (g - d_{ox} - W)/e]^{-1} \quad \text{(eq. 1)}$$

dox is the combined thickness of an oxide layer 308 on channel 304 and a thin oxide layer (not shown) on gate membrane 306. Variables e and eox are respectively the electric permittivity of free space and silicon dioxide.

MOGFET 300 can operate in a variety of modes which rely on current saturation conditions (pinch-off in the conducting channel). When gate 306 and drain 303 are coupled together, eq. 2 is the basic equation describing the drain-source voltage Vds of MOGFET 300 during saturation with a fixed current I.

$$V_{DS} = \sqrt{2I \frac{L}{\mu Z C(W)}} - \frac{E_g}{2} + kT\ln\left(\frac{N_b}{n_i}\right) + \frac{Q_f}{C(W)} + \frac{\sqrt{2N_b q e_s \left[ 2kT\ln\left(\frac{N_b}{n_i}\right) - V_{BS} \right]}}{C(W)} \quad \text{(eq. 2)}$$

In eq. 2, symbols L, Z, $\mu$, $E_g$, T, $N_b$, $n_i$, $Q_f$, and $V_{BS}$ represent respectively the channel length, the channel width, the channel charge mobility, the channel region bandgap voltage, the temperature, the channel doping (number of charge carriers per cm$^3$), the intrinsic carrier density, the bulk oxide charge of MOGFET 300, and voltage difference between the body (or substrate) and the source, and symbols k, q, and e, represent the Boltzman constant, the charge of an electron, and the relative permittivity of silicon. The first addend $\sqrt{2I[L/(\mu Z C(W))]}$ in eq. 2 is referred to herein as the square root term. The remaining addends of eq. 2 are sometimes referred to as linear terms.

Two sensing modes in accordance with this invention are based on eq. 2. The first mode (sometimes referred to herein as the square-root mode) provides an output voltage proportional to the square-root term, and the second mode (sometimes referred to herein as the linear mode) provides an output voltage linearly related to the deflection. The two sensing modes are differentiated by circuit configuration, physical structure, placement of active regions, and operating currents.

Figure 4A:
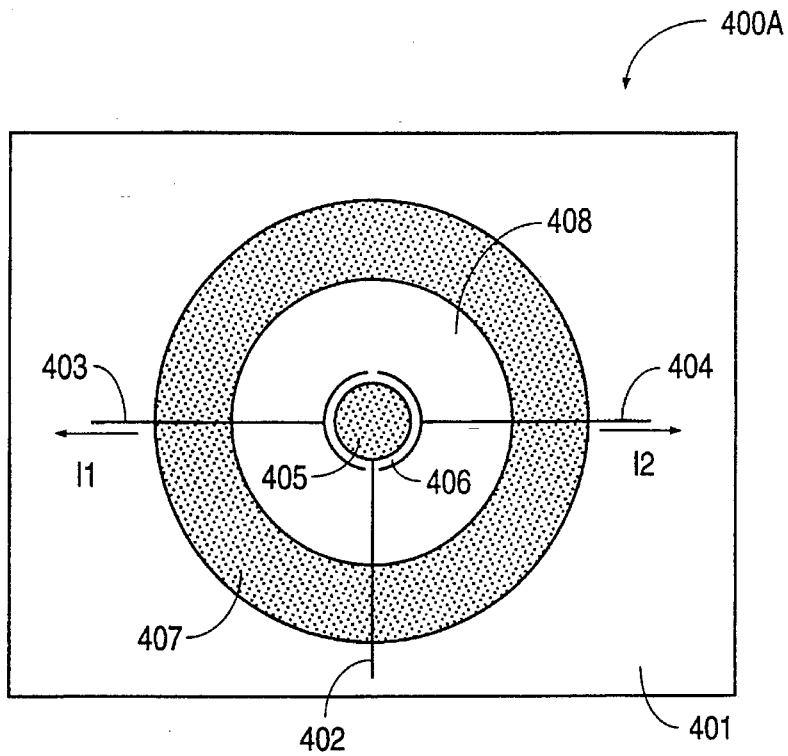
FIG. 4A shows a plan view of a square root mode sensor in accordance with an embodiment of the invention.

FIG. 4A shows a plan view of a square root mode sensor 400A which has a drain 402, two sources 403 and 404, and two channel regions 405 and 406 diffused in a substrate 401 and underlying a single gate membrane (not shown) supported by a ring-shaped spacer 407. Drain 402 is electrically coupled to the gate membrane. If a current I1 through source 403 and channel 405 differs from a current I2 through source 404 and channel 406, or if a Width of channel 405 differs from a width of channel 406, then a voltage difference between sources 403 and 404 is the difference between two square root terms. Linear terms and temperature dependence in eq. 2 being independent of current and channel width cancel from the voltage difference. The voltage difference between the sources may be converted to a signal proportional to the deflection plus a constant using a conventional squaring circuit (not shown) implemented with MOS circuitry integrated in substrate 401.

Channels 405 and 406 are placed symmetrically about the center of cavity 408 so that when the gate membrane spanning cavity 408 deflects, deflections toward channel 405 equal deflections toward channel 406. In one embodiment, channels 405 and 406 have the same width Z and length L. To improve rejection of the linear terms in eq. 2, the ratio Z/L of channel width Z to channel length L should be small or moderate, for example, in the range 1:1 to 20:1. Drive currents I1 and I2 on the order of about 50 to 250 µA are reasonable for this operation.

Figure 4B:
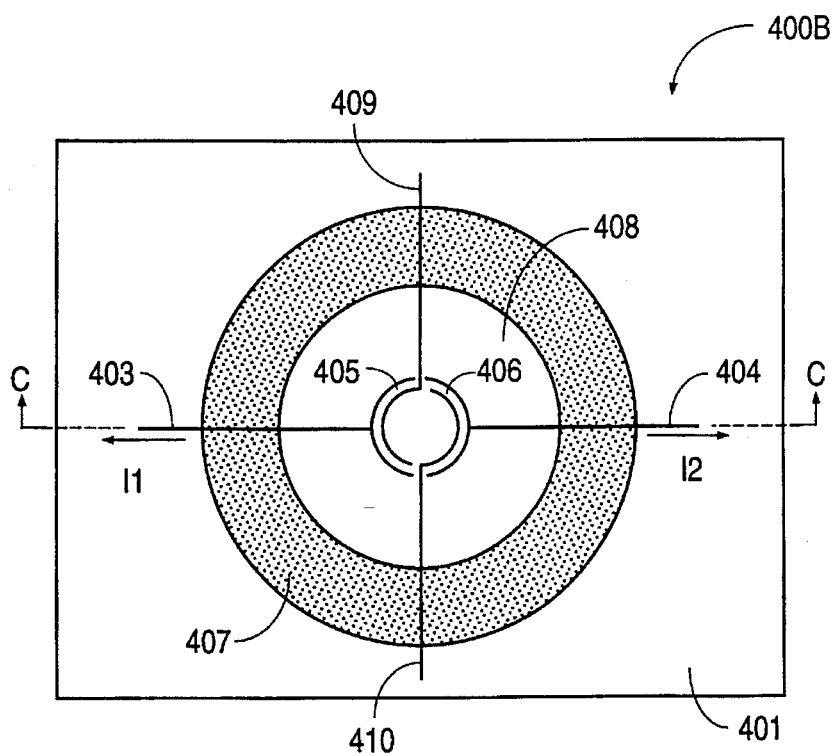
FIGS. 4B and 4C show a plan view and cross-sectional view of a square root mode sensor in accordance with another embodiment of the invention.
Figure 4C:
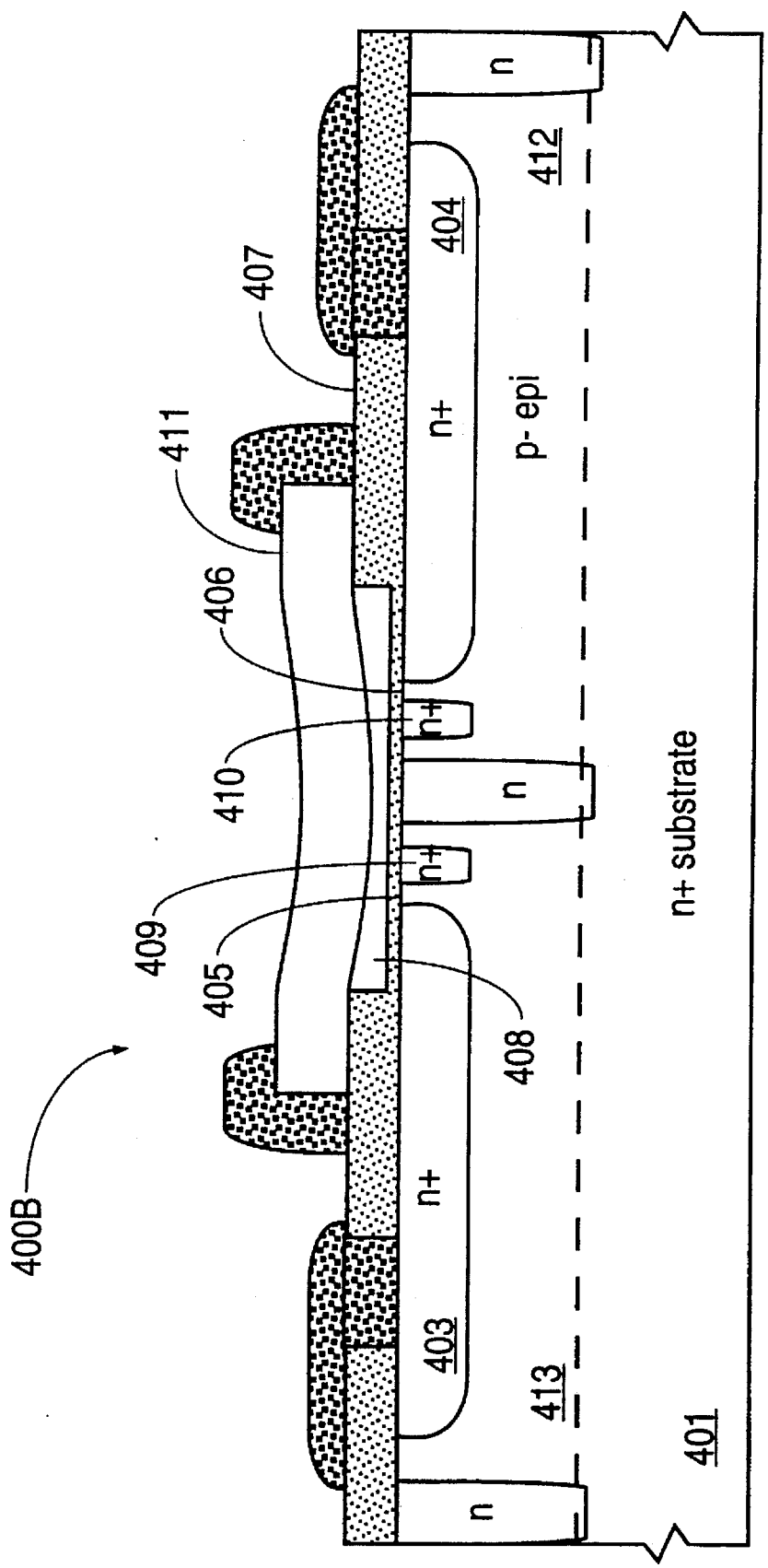

FIGS. 4B and 4C show an alternative square root mode sensor 400B. Elements in FIGS. 4A, 4B, and 4C which have the same reference symbols are similar or identical, and the description of those element in regard to FIG. 4A applies to FIGS. 4B and 4C. Sensor 400B differs from sensor 400A in that sensor 400B includes separate drains 409 and 410 for sources 403 and 404 respectively. Drains 409 and 410 are electrically connected together through a flexible gate membrane 411.

An advantage of sensor 400B is illustrated by the cross-sectional view shown in FIG. 4C. In sensor 400B, source 403, drain 409, and channel 406 are formed in a first isolation well 412, and source 404, drain 410, and channel 405 are farmed in a second isolation well 413. The two wells 412 and 413 can be biased at different voltages to cancel the body effect which would result from sources 404 and 403 being at different voltages with respect to a body containing sources 404 and 403. The appropriate body voltages may be provided by tying wells 412 and 413 to source 403 and 404 respectively. The body effect otherwise introduces a voltage difference between the voltage on source 404 and the voltage on source 403 that depends linearly on the deflection of gate membrane 411.

Figure 5:
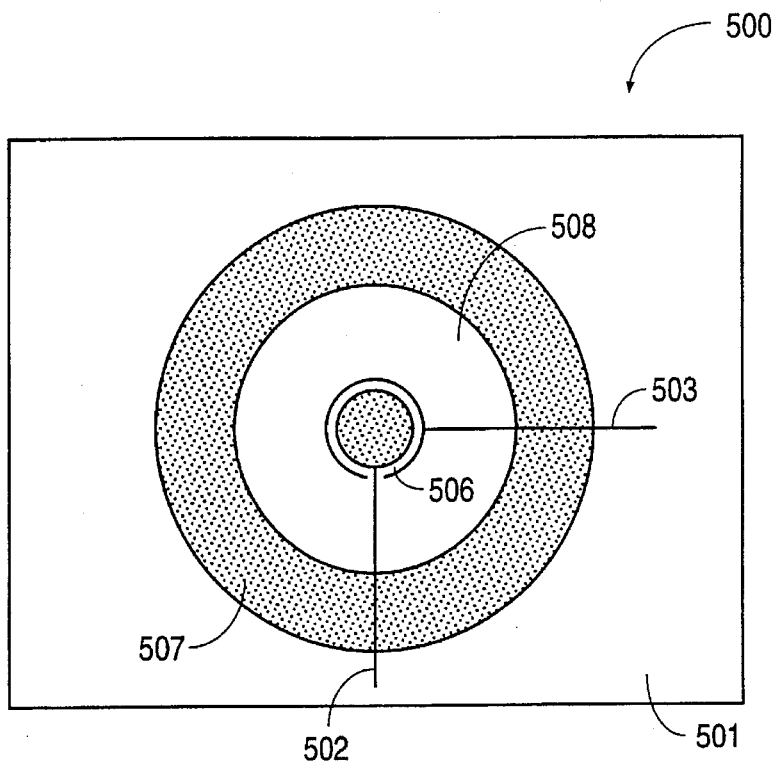
FIG. 5 shows a plan view of a linear mode sensor in accordance with an embodiment of the invention.

A linear sensing mode is achieved by suppressing the square-root term in eq. 2. Suppression is achieved by a MOGFET with a high channel width to channel length ratio Z/L (from 50:1 to on the order of about 100:1) driven with a small supply current (about 10 μA). In this way, the non-linearity caused by the square-root term is reduced to an acceptable level (less than about 0.2%). FIG. 5 shows a plan view of a MOGFET 500 for linear sensing mode. MOGFET 500 has a source 503, a drain 502, and a channel 506 diffused in a substrate 501. Source 503 nearly encircles drain 502 to maximize the width of channel 506. The temperature dependence of the drain-source voltage Vds of transistors 500 is known, and can be compensated for by circuitry using conventional techniques such as temperature independent biasing and differential transistor matching.

Signals from linear mode sensors and square-root mode sensors (after processing by a squaring circuit) exhibit a constant offset voltage. A sensor's offset voltage is a function of structure and fabrication parameters. A sensor can cancel the offset voltage by measuring a differential voltage between transistors subjected to different gate membrane deflections.

Figure 6:
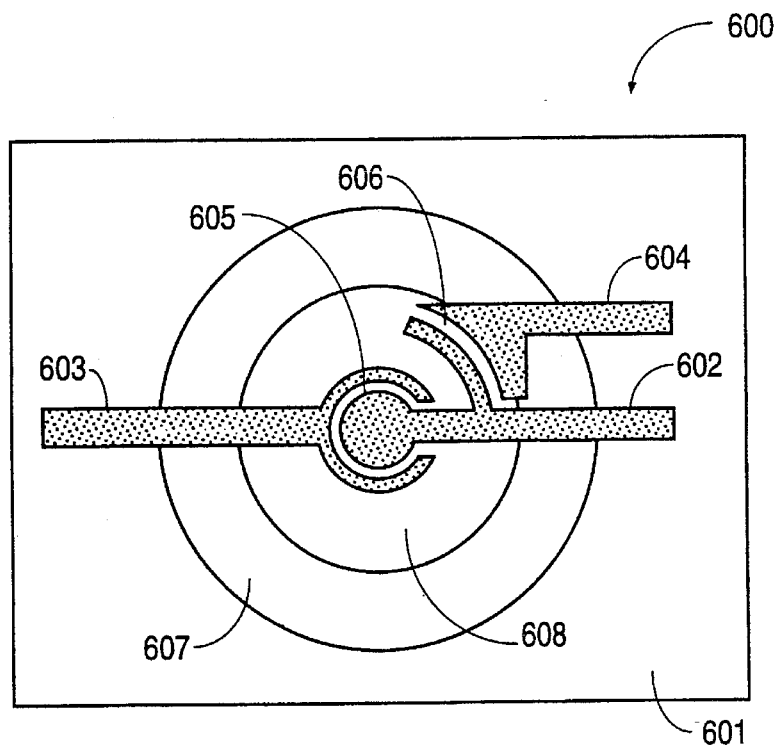
FIG. 6 shows a plan view of a linear mode sensor in accordance with another embodiment of the invention.

FIG. 6 shows a linear mode sensor 600 which measures a differential voltage between sources 603 and 604 to cancel a constant offset voltage. The two sources 603 and 604 and a drain 602 define channels 605 and 606 at different radii from a central axis of the cavity formed by a ringed-shaped spacer 607, substrate 601, and a gate membrane (not shown). In response to a uniform pressure, gate membrane deflects most at the membrane's center and deflects less where the membrane attaches to spacer 607. Thus, channel regions 605 and 606 are subjected to different gate deflections. The voltages on source 603 and 604 are linearly related to deflection but are not proportional to deflection because of the constant offset voltage that arises from terms in eq. 2 which are independent of deflection. Measuring the difference between the voltages on source 603 and 604 cancels the constant offset voltage and provides a signal which is approximately proportional to the gate deflection.

Figure 7:
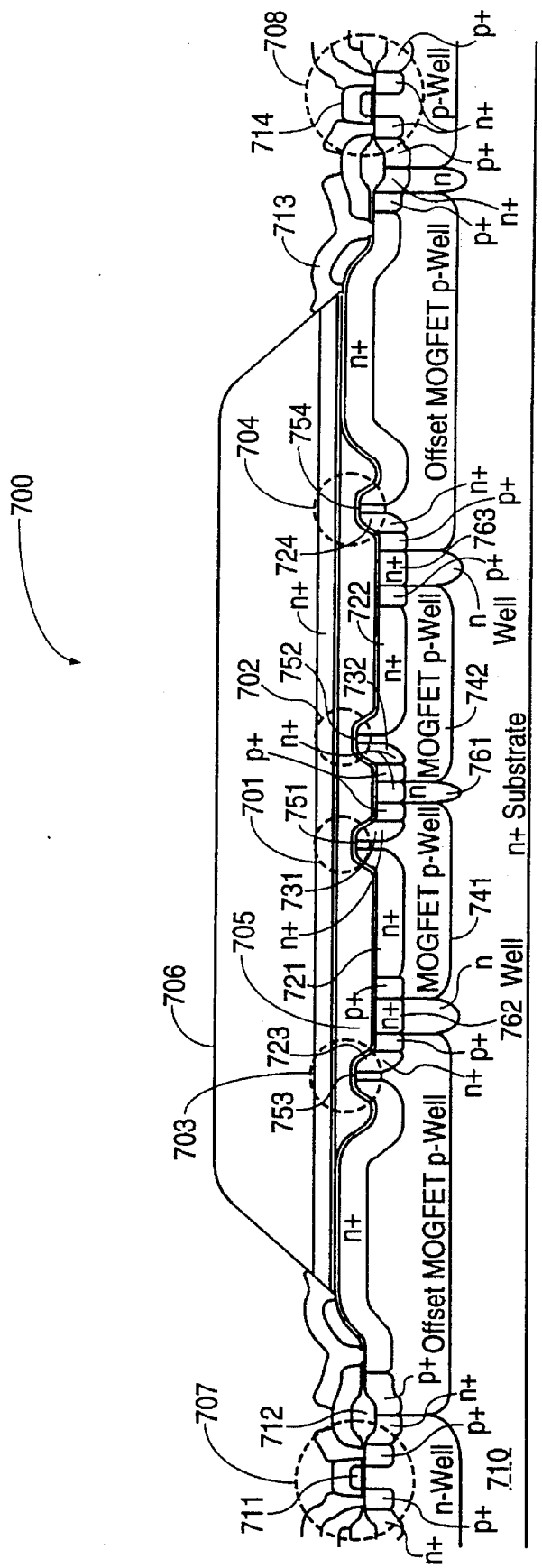
FIG. 7 shows a cross-sectional view of a MOGFET absolute pressure sensor in accordance with an embodiment of this invention.

FIG. 7 shows a cross-sectional view of a MOGFET absolute pressure sensor 700 that operates in square root mode and has an offset voltage cancellation. In sensor 700, a gate membrane 706 acts as the gate for four transistors 701 to 704. Transistors 701 and 702 have respectively sources 721 and 722, drains 731 and 732, and channels 751 and 752. Channels 751 and 752 are at the same radius from the axis of a cavity 705 and experience the same amount of deflection W. As described above in regard to FIGS. 4A, 4B, and 4C, by operating transistor 701 and 702 at different currents, the voltage difference between source 721 and 722 is independent of the linear terms in eq. 2 and provides a first square root signal given approximately by the square root term in eq. 2 for deflection W.

Transistors 703 and 704 have channel regions 754 and 753 at a second radius and are affected by a second gate deflection W'. The voltage difference between sources 723 and 724 provides a second square root signal given by the square root term in eq. 2 for the second deflection W'. A squaring circuit converts the first and second square root signals to a first squared signal proportional to deflection W plus an offset and a second squared signal proportional to deflection W' plus the same offset. Taking the difference between the first and second squared signals cancels the offset.

The squaring circuit can be formed from conventional MOS devices such as N channel transistor 708 and P channel transistor 707 formed in and on substrate 710. Such conventional devices 707 and 708 are formed with standard techniques and include conventional structures such as polysilicon gates 711, field oxide isolation regions 712, metal interconnects and contacts 713, and low temperature oxide insulating layers 714.

FIG. 7 also illustrates a contoured middle plane at the bottom of cavity 705. Transistors 701 to 704 have channel regions 751 to 754 located on bumps, so that channel regions 751 to 754 are closer to gate membrane 706 than are isolation wells 741 and 742 and sources 721 and 722. Shaping the bottom of cavity 705 keeps channel regions 751 to 754 close enough to gate membrane 706 to provide desired threshold voltages for transistors 701 to 704 and reduces electrostatic attraction between gate membrane 706 and the bottom of cavity 705.

Figure 8:
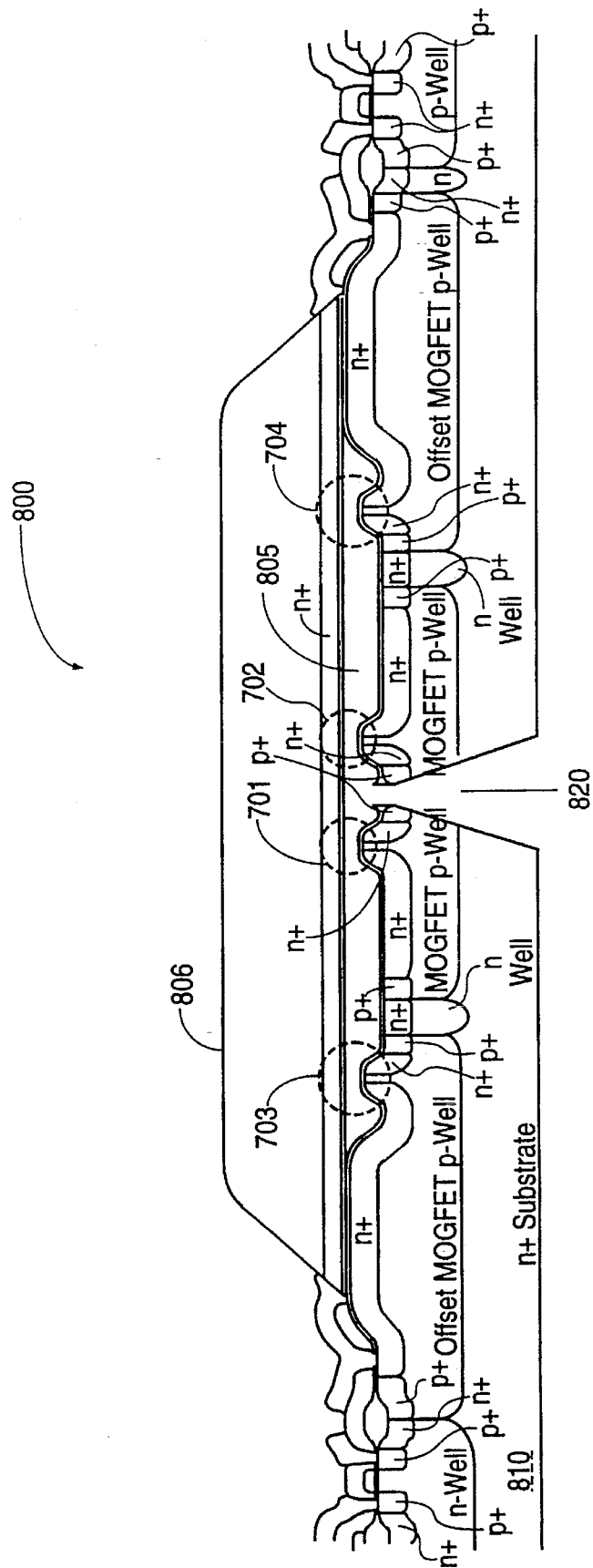
FIG. 8 shows a cross-sectional view of a MOGFET differential pressure sensor in accordance with an embodiment of this invention.

FIG. 8 shows a cross-sectional view of a MOGFET differential pressure sensor 800 which operates in square root mode. Sensor 800 contains many structures which are similar or identical to the structures of sensor 700 of FIG. 7 and have the same reference symbols. The above description of these elements in regard to sensor 700 also applies to sensor 800. Sensor 800 differs from sensor 700 in that a through hole 820 is formed through substrate 810 to cavity 805. Hole 820 passes through an area of substrate 810 corresponding to isolation well 761 in substrate 710 of FIG. 7. Hole 820 may be formed by masking the back of substrate 810 using an infrared or backside aligner before fusion bonding. After fusion bonding, hole 820 is isotropically etched to a stop layer (oxide) which is then opened using plasma etching. A typical hole 820 is tapered in cross section and for a wafer thickness of about 400 μm, has a diameter of about 600 μm at the backside of wafer 810 to provide a 5-μm diameter opening to cavity 805. Gas pressure from the back of wafer 810 fills cavity 805 and presses on a bottom surface of gate membrane 706. Pressure at the front of wafer 810 presses on a top surface of gate membrane 806. The deflection of gate membrane 806 depends of the pressure difference between on the front and back of wafer 810.

Figure 9A:
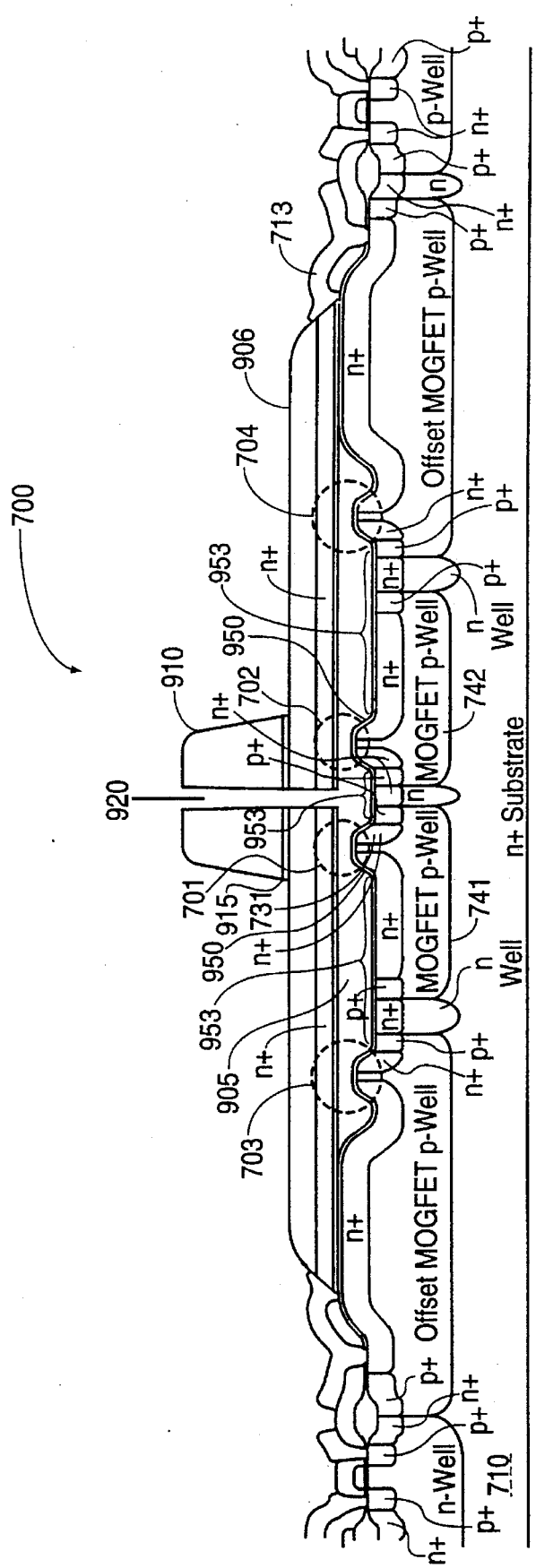
FIG. 9A shows a cross-sectional view of a MOGFET accelerometer in accordance with an embodiment of this invention.
Figure 9B:
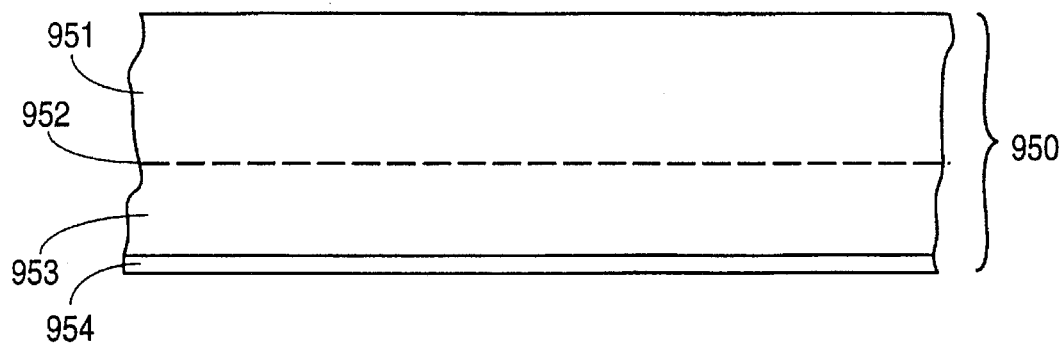
FIGS. 9B, 9C, 9D, and 9E show cross-sectional views of a wafer during formation of the gate structure shown in FIG. 9A.

FIG. 9A shows a cross-sectional view of a MOGFET accelerometer 900 which operates in square root mode. Accelerometer 900 contains structures which are similar or identical to the structures of sensor 700 of FIG. 7 and have the same reference symbols. The above description of these elements in regard to sensor 700 also applies to accelerometer 900. Accelerometer 900 differs from sensor 700 in that a mass 910 on a membrane 906 is located near the center of cavity 905, and a vent hole 920 penetrates through mass 910 and membrane 906 to cavity 905. Vent hole 920 equalizes pressure on top and bottom surfaces of membrane 906, so that membrane 906 is not deflected by changes in atmospheric pressure. During acceleration, the inertia of mass 910 deflects membrane 906, and the size of the deflection is sensed as describe for sensor 700 of FIG. 7.

Figure 9C:
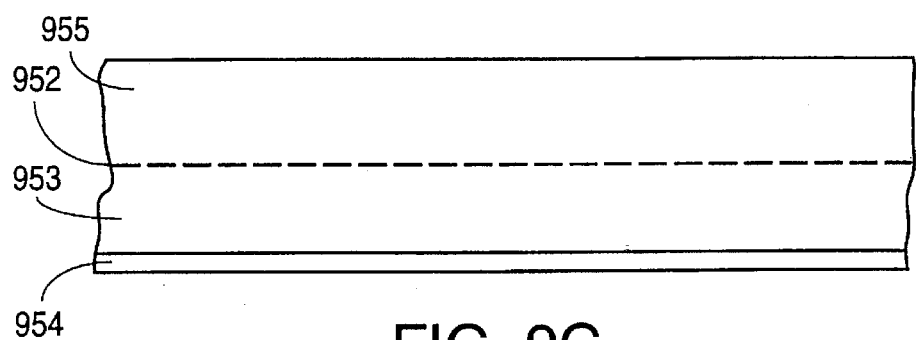
Figure 9D:
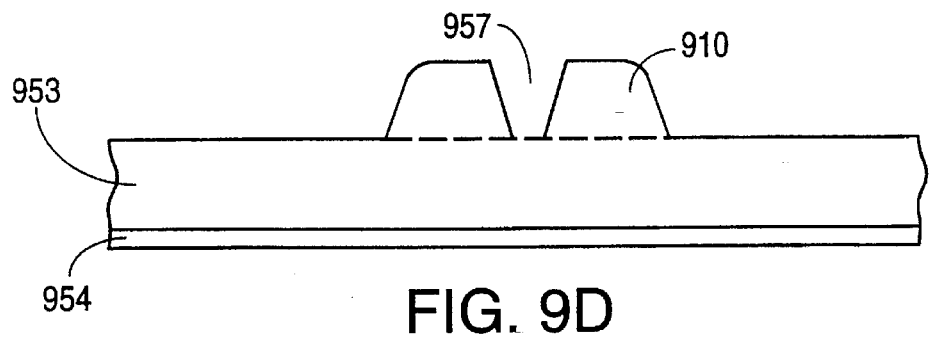
Figure 9E:
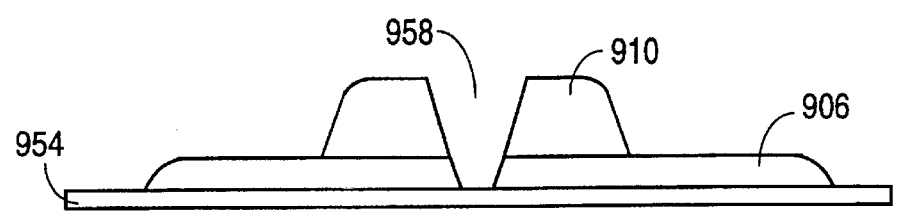

Membrane 906, mass 910, and vent hole 920 may be formed by masking and etching a wafer which is fusion bonded to substrate 710. FIGS. 9B to 9E illustrate formation of membrane 906 and mass 910 from a wafer 950. Wafer 950 contains a handle layer 951, an etch-stop layer 952, and a membrane layer 953. For a typical embodiment, handle layer 951 is an N type silicon substrate; etch-stop 952 is a silicon dioxide layer, a buried P+ layer, or an electrochemical etch-stop layer; and membrane layer 953 is a monocrystalline silicon epitaxial layer. An oxide layer 954 is formed on wafer 950 during fusion bonding. After fusion bonding of wafer 950 to substrate 710, wafer 950 is thinned by a timed potassium hydroxide (KOH) etch so that the thickness of a handle layer 955 as shown in FIG. 9C is the desired height of mass 910. Alternatively, other etches, grinding, or polishing can thin wafer 950. Handle layer 955 is then masked and etched to etch-stop layer 952 to form mass 910 and a hole 957 as shown in FIG. 9D. Membrane layer 953 is then masked and etched to form membrane 906 having a hole 958 to oxide layer 954. Final opening of vent hole 920 through oxide layer 954 is typically done by plasma etching after formation of metal interconnects 713 (FIG. 9A). Vent hole 920 may be positioned so that etching through to cavity 905 does not damage underlying active regions.

As described above, channel bumps 950 place channel regions closer to gate membrane 906 and reduce threshold voltages, and surrounding depressions 953 reduce electrostatic attraction between gate membrane 906 and substrate 710. In accelerometer 900, depressions 953 can be additionally shaped to increase gas flow through vent hole 920 during motion of membrane 906. Increasing gas flow reduces "squeeze-film" damping which dampens the motion of membrane 906. The sizes of depressions 953 and vent hole 920 can be adjusted to effect a desired mechanical frequency response and damping level in accelerometer 900.

In any of the above embodiments, diffused conductors under the gate membrane may reduce electrostatic forces which deflect the gate membranes. For example, in FIG. 7, isolation wells 761, 762, and 763 can be biased at the same voltage as membrane 706 and expanded to cover the majority of area under membrane 706 to reduce electrostatic attraction between membrane 706 and substrate 710.

Figure 10A:
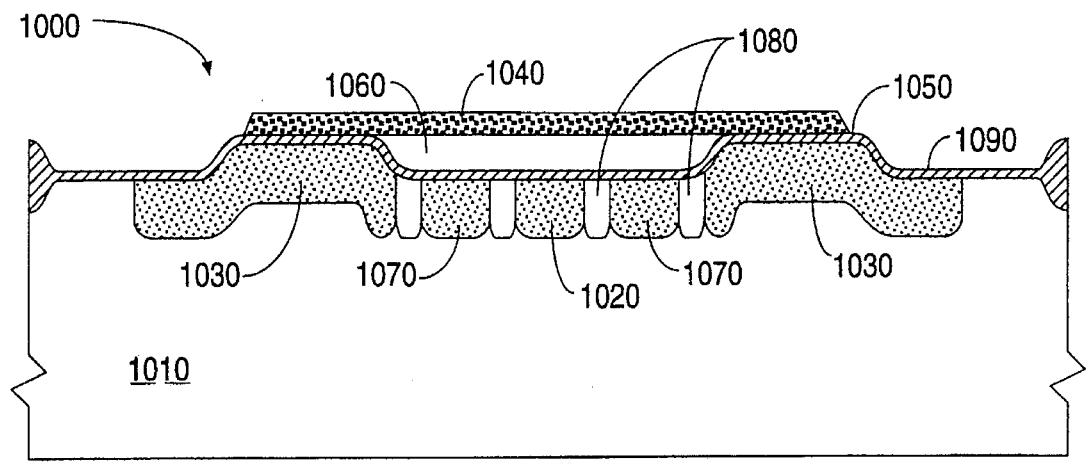
FIGS. 10A and 10B respectively show cross-sectional and plan views of a capacitive sensor in accordance with an embodiment of this invention.
Figure 10B:
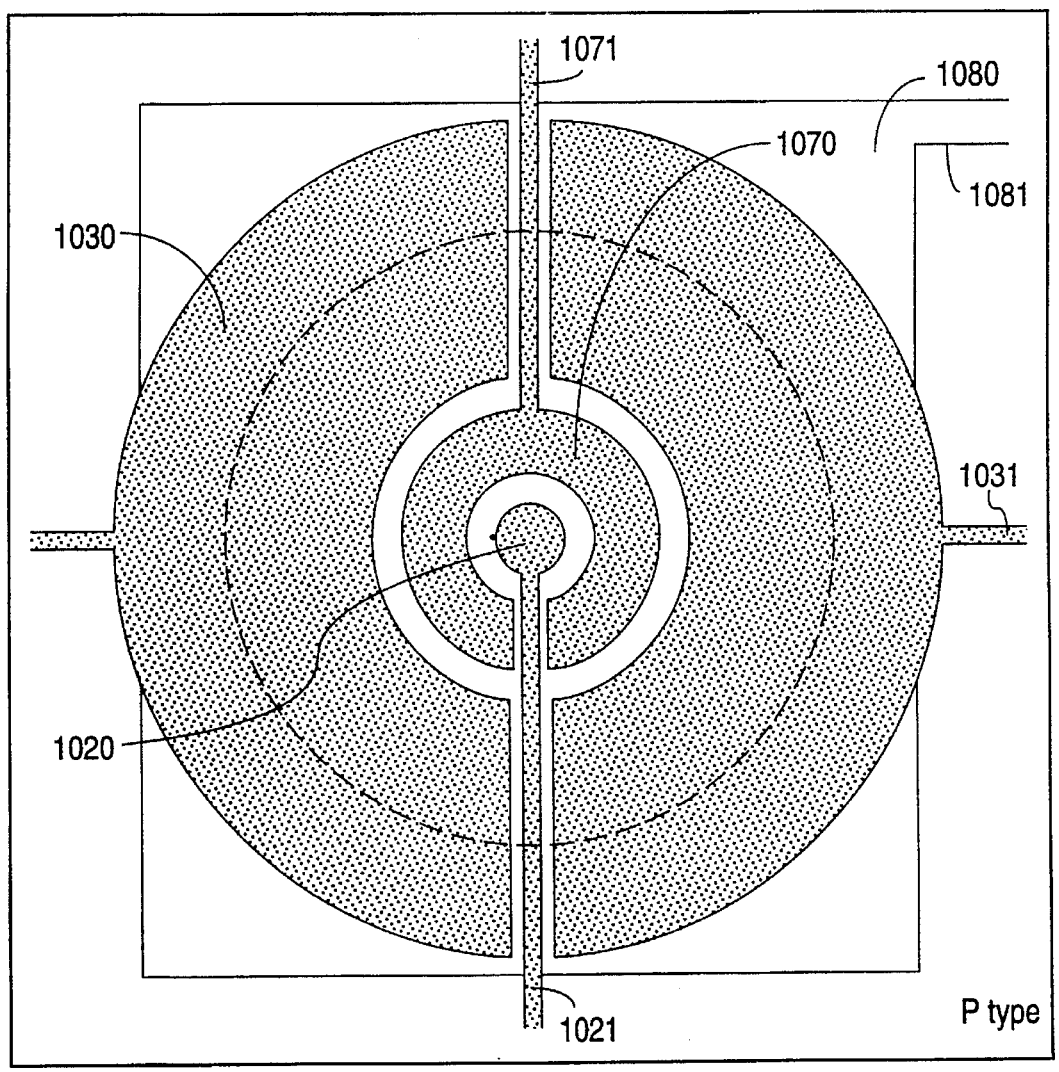

FIGS. 10A and 10B show a cross-sectional view and a plan view of a MOPCAP sensor 1000 in accordance with an embodiment of this invention. In sensor 1000, a flexible membrane 1040 and a doped region 1020 formed in a substrate 1010 are separated by the height of a cavity 1060. Membrane 1040 is omitted from FIG. 10B to better show underlying structures. The embodiment shown in FIGS. 10A and 10B is an absolute pressure sensor having a sealed cavity 1060. Alternate embodiments include differential pressure sensors having venting holes through substrate 1010 to cavity 1060 and accelerometers having venting holes through membrane 1040. Additionally, a mass may be added to membrane 1040 for use as an accelerometer.

Region 1020 is disposed near the center of cavity 1060 where changes in pressure cause the greatest deflection of membrane 1040. Accordingly, the fractional change in capacitance between membrane 1040 and region 1020 per change in pressure is relatively large. A pressure change causes a smaller fractional change in the capacitance between membrane 1040 and a region 1030 because capacitance between membrane 1040 and region 1030 is relatively large and deflection of membrane 1040 is relatively small over region 1030. Capacitance between membrane 1040 and region 1030 is large because a portion of region 1030 near a bonding area 1050 is only separated from membrane 1040 by the thickness of an insulating layer 1090. Accordingly, changes in the capacitance between membrane 1040 and region 1030 would provide a low signal to noise ratio for a signal dependent on changes in capacitance.

To make the signal from sensor 1000 insensitive to the capacitance between membrane 1040 and region 1030, region 1030 is isolated from region 1020 and biased at about the same voltage as membrane 1040. A high input impedance amplifier which is coupled from membrane 1040 through a feedthrough 1031 to region 1030 can bias region 1030. The amplifier can be formed in a device plane of substrate 1010 surrounding sensor 1000.

Sensor 1000 also includes an optional reference capacitor region 1070. Pressure changes the capacitance between membrane 1040 and region 1070 less than pressure changes the capacitance between membrane 1040 and region 1020, because region 1070 is further from where deflection of membrane 1040 is greatest. However, region 1070 is formed in the same substrate, subjected to the same environment as region 1020, so that temperature or other environmental factors change capacitance of regions 1020 and 1070 in a similar fashion. Two sensing circuits (not shown), one connected through a feedthrough 1021 to region 1020 and the other connected through a feedthrough 1071 to region 1070, can be adjusted to provide equal signals when membrane 1040 is undeflected. A difference between the signals from the two sensing circuits changes with deflection of membrane 1040 because capacitance due to region 1020 changes more with deflection, but the difference is insensitive to temperature changes because temperature changes are similar for the two regions 1020 and 1070. Several well known sensing circuits such as a capacitive bridge circuit, a switch capacitor circuit, or an oscillator incorporating MOPCAP sensor 1000 can sense the capacitances of region 1020 and 1070 and can be fabricated in substrate 1010 near sensor 1000 to reduce signal noise introduced by capacitive leads.

In FIGS. 10A and 10B, isolation regions 1080 separate and electrically isolate regions 1020, 1070, and 1030. Isolation regions 1080 have an opposite doping type from regions 1020, 1070, and 1030. In an example embodiment of FIGS. 10A and 10B, regions 1020, 1070, and 1030 are N type regions and regions 1080 are P type regions formed in a P type substrate 1010. Alternatively, region 1030 can have an opposite doping type from region 1020 and 1070, and isolation regions between region 1030 and 1020 or 1070 could be eliminated because region 1030 is at a voltage which would reverse bias a junction between region 1030 and region 1020 or 1070.

Although the present invention has been described with reference to particular embodiments, the description is only an example of the invention's application and should not be taken as a limitation. Various adaptations and combinations of features of the embodiments disclosed will be apparent to those skilled in the art and are within the scope of the present invention as defined by the following claims.

We claim:

1. A process for making a semiconductor device containing a flexible structure, comprising the steps of:

oxidizing a portion of a surface of a first semiconductor substrate to form a first oxide region and leave an unoxidized region on the surface;

removing the first oxide region to form a depression in the first substrate; and bonding a second substrate to the unoxidized region of the first substrate so that a portion of the second substrate overlies the depression.

2. The process of claim 1, further comprising forming a second semiconductor device in and on the first substrate.

3. The process of claim 2, wherein forming the second semiconductor device comprises forming a field effect transistor.

4. The process of claim 2, wherein forming the second semiconductor device comprises forming a bipolar transistor.

5. The process of claim 1, further comprising the step of forming an active region in the depression.

6. The process of claim 5 wherein forming the active region comprises forming a channel region for the semiconductor device, and the portion of the second substrate that overlies the depression forms a gate for the semiconductor device.

7. The process of claim 5, wherein the step of forming the active region is performed before the oxidizing step.

8. The process of claim 7, wherein the step of forming the active region further comprises the step of forming a doped region to a depth in the first substrate greater than a depth of the depression.

9. The process of claim 1, further comprising the step of shaping the second substrate to form a membrane over the depression.

10. The process of claim 1, where bonding comprises fusion bonding the second substrate to the first substrate.

11. A process for making a semiconductor device containing a flexible structure, the process comprising:

oxidizing a portion of a surface of a first semiconductor substrate to form a first oxide region and leave an unoxidized region on the surface, wherein the unoxidized region encompasses the first oxide region;

removing the first oxide region to form in the first substrate a depression which is encompassed by the unoxidized region;

oxidizing the surface of the first substrate to form a second oxide region encompassing the unoxidized region of the surface;

removing the second oxide region to leave a mesa containing the depression, on the surface of the first substrate;

forming an active region in a portion of the first substrate defined by the depression; and fusion bonding a second substrate to the unoxidized region of the first substrate so that a portion of the second substrate overlies the depression.

12. The process of claim 11, wherein removing the second oxide region is performed before forming and removing the first oxide region.

13. The process of claim 11, further comprising the step of shaping the second substrate to define a flexible structure overlying the depression.

14. The process of claim 13, wherein:

the second substrate includes an etch stop layer;

the fusion bonding step bonds a first surface of the second substrate to the surface of the first substrate; and shaping the second substrate comprises etching the second substrate to remove a portion of the second substrate between a second surface and the etch stop layer.

15. The process of claim 13, wherein the shaping step comprises:

oxidizing a portion of the second substrate; and removing an oxide region formed during oxidation of the second substrate.

16. The process of claim 11, wherein the steps of oxidizing to form the first and second oxide regions are performed simultaneously.

17. The process of claim 16, further comprising the steps of:

oxidizing the first substrate to form an oxide region in a bottom surface of the depression; and removing the oxide region to leave a bump on the bottom surface of the depression.

18. The process of claim 17, wherein the step of forming an active region comprises forming a channel region for the semiconductor device in the bump on the bottom surface of the depression.

19. The process of claim 11, further comprising forming an electronic device in and on a portion of the first substrate surrounding the mesa.

20. A process for making a semiconductor device containing a flexible structure, the process comprising:

oxidizing a portion of a surface of a first semiconductor substrate to form a first oxide region and leave an unoxidized region on the surface;

removing the first oxide region to form a depression in the first substrate;

bonding a second substrate to the unoxidized region of the first substrate so that a portion of the second substrate overlies the depression; and shaping the second substrate to form a cantilever over the depression.

21. The process of claim 20, wherein the first oxidized region encompasses the unoxidized region.

22. The process of claim 21, further comprising the step of forming an active region in the depression.

23. A process for making a semiconductor device having a flexible structure, comprising:

shaping a first semiconductor substrate to form a depression in a first surface of the first semiconductor substrate;

forming an active region in a second semiconductor substrate;

bonding the first surface of the first substrate to the second substrate so that the depression overlies the active region; and shaping a second surface of the first substrate to form a flexible structure over the active region.

24. The process of claim 23, wherein the step of shaping the second surface of the first substrate comprises the step of etching from the second surface to an etch stop layer in the first substrate.

25. The process of claim 24, wherein the step of shaping a second surface of the first substrate further comprises the step of masking the second surface to expose only portions of the first substrate to the etching step.

26. The process of claim 23, further comprising the steps of:

oxidizing a portion of the second semiconductor substrate to form an oxide region and an unoxidized region on the second semiconductor substrate;

removing the oxide region to form a depression in the second substrate, wherein after the bonding step the depression in the first semiconductor substrate overlies at least a portion of the depression in the second semiconductor substrate and at least a portion of the unoxidized region in the second semiconductor substrate.

27. The process of claim 23, further comprising the step of forming a second semiconductor device in and on the second substrate.

28. The process of claim 27, wherein the step of forming the second semiconductor device comprises forming a field effect transistor.

29. The process of claim 27, wherein the step of forming the second semiconductor device comprises forming a bipolar transistor.

30. A process for making a semiconductor device having a flexible structure, comprising:

etching a first substrate to form a mesa;

oxidizing the first substrate to form an oxide region on the mesa;

removing the oxide region to form the depression in the mesa;

forming an active region in a second semiconductor substrate;

fusion bonding the first substrate to the second substrate so that the depression overlies the active region; and shaping a second surface of the first substrate to form a flexible structure over the active region.

31. The process of claim 30, further comprising the step of forming a source and a drain in the second substrate, wherein the step of forming the active region comprises forming a channel between the source and the drain.

32. A process for making a semiconductor device containing a flexible structure, the process comprising:

shaping a first semiconductor substrate to form a mesa and a depression in a top surface of the mesa, wherein the top surface of the mesa is elevated relative to a surface that surrounds the mesa;

forming an active region in a portion of the first semiconductor substrate defined by the depression; and bonding a second substrate to the top surface of the mesa so that a portion of the second substrate overlies the active region.

33. The process of claim 32, further comprising forming a second semiconductor device in and on the surface which surrounds the mesa.

34. The process of claim 32, further comprising shaping the second substrate to define a flexible structure overlying the depression.

35. The process of claim 32, where bonding comprises fusion bonding the second substrate to the first substrate.

* * * * *